United States Patent
Takahashi

(10) Patent No.: US 8,532,479 B2
(45) Date of Patent: Sep. 10, 2013

(54) ELECTRONIC APPLIANCE AND CAMERA DEVICE

(75) Inventor: Masami Takahashi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 42 days.

(21) Appl. No.: 13/263,130

(22) PCT Filed: Feb. 23, 2010

(86) PCT No.: PCT/JP2010/001166
§ 371 (c)(1),
(2), (4) Date: Dec. 22, 2011

(87) PCT Pub. No.: WO2010/116592
PCT Pub. Date: Oct. 14, 2010

(65) Prior Publication Data
US 2012/0093497 A1    Apr. 19, 2012

(30) Foreign Application Priority Data
Apr. 7, 2009  (JP) .................................. 2009-093004

(51) Int. Cl.
*G03B 17/02*  (2006.01)
*H05K 9/00*  (2006.01)

(52) U.S. Cl.
USPC ........................................... 396/535; 29/592.1

(58) Field of Classification Search
USPC ...................................... 396/535; 29/592.1
See application file for complete search history.

(56) References Cited

U.S. PATENT DOCUMENTS

| 3,539,973 | A | * | 11/1970 | Wright et al. | 439/90 |
| 5,722,055 | A | * | 2/1998 | Kobayashi et al. | 455/575.8 |
| 6,553,188 | B2 | * | 4/2003 | Tanaka | 396/535 |
| 7,001,213 | B2 | * | 2/2006 | Kaneko et al. | 439/579 |
| 2008/0003015 | A1 | * | 1/2008 | Tomatsu | 399/110 |

FOREIGN PATENT DOCUMENTS

| JP | 01287549 A | * 11/1989 |
| JP | 04-105591 | 9/1992 |
| JP | 08-130387 | 5/1996 |
| JP | 08-274486 | 10/1996 |
| JP | 11-338361 | 12/1999 |
| JP | 2007-019371 | 1/2007 |
| JP | 2010245335 A | * 10/2010 |

OTHER PUBLICATIONS

Machine Translation of JP08-130387 May 1996.*
Machine Translation of JP2007-019371 Jan 2007.*
Notification of Transmittal of Translation of the International Preliminary Report on Patentability, dated Nov. 24, 2011.

* cited by examiner

*Primary Examiner* — Christopher Mahoney
(74) *Attorney, Agent, or Firm* — Greenblum & Bernstein, P.L.C.

(57) ABSTRACT

An electronic appliance which can be a camera device includes a resin case containing electronic components for taking a camera images, and a metal shield member attachable to the inside of the case. The shield member is provided with two staking holes, and three staking tabs which protrude inwardly are provided around each of the staking holes. The case is provided with a boss in a position corresponding to each of the staking holes. When the shield member is attached to the case, each boss is pushed into the staking hole and fastened by the three deformed staking tabs, so that the shield member is fixed to the case.

12 Claims, 7 Drawing Sheets

ELECTRONIC APPLIANCE AND CAMERA DEVICE

TECHNICAL FIELD

The present invention relates to an electronic appliance having a function of suppressing unwanted radiation.

BACKGROUND ART

Generally, when an electronic appliance operates, unwanted radiation is generated from electronic components provided inside the electronic appliance. If this unwanted radiation leaks to the outside of the housing, it may affect operation of other electronic components. Therefore, there is a need for a measure to prevent such unwanted radiation from leaking to the outside of the housing as much as possible. Conventionally, to suppress unwanted radiation from an electronic component or the like provided inside an electronic appliance, a method of applying a conductive coating material to a resin housing has been proposed (for example, see Patent Literature 1).

However, in the conventional method, many process steps are required for application and drying of a conductive coating material and so on, which increases man-hours required for fabrication. In addition, it is time consuming to wait for the conductive coating material to be dried because the next process step cannot be started until the conductive coating material is sufficiently dried. Further, since such a conductive coating material is a relatively expensive material (compared to metallic plates and the like), and dedicated machines (expensive machines) are needed for application and drying, the manufacturing cost is accordingly increased.

CITATION LIST

Patent Literature

Patent Literature 1: Japanese Patent Laid-Open No. 11-338361

SUMMARY OF INVENTION

Technical Problem

The present invention has been made in view of the above described background. An object of the present invention is to provide an electronic appliance which can suppress unwanted radiation, and which can be fabricated in a reduced number of process steps and a reduced time, and the manufacturing cost can be kept low.

Solution to Problem

One aspect of the present invention is an electronic appliance including a resin case containing electronic components, and a metal shield member to be attached to an inside of the case, wherein the shield member includes at least one staking hole (a hole for part fixing), a plurality of staking tabs (fixing sections) which protrude inward are provided around the staking hole, and the case includes a boss (a projecting portion for part fixing) in a position corresponding to the staking hole, and wherein in a state where the shield member is attached to the case, the boss is pushed into the staking hole, and the boss is fastened by the plurality of deformed staking tabs so that the shield member is fixed to the case.

Another aspect of the present invention is a camera device including a resin case containing electronic components for taking a camera image, and a metal shield member to be attached to an inside of the case, wherein the shield member includes at least one staking hole, a plurality of staking tabs which protrude inward are provided around the staking hole, and the case includes a boss in a position corresponding to the staking hole, and wherein in a state where the shield member is attached to the case, the staking hole is fitted around the boss of the case, and the boss is fastened by the plurality of staking tabs so that the shield member is fixed to the case.

As described below, there are further aspects of the present invention. Thus, the disclosure of the present invention is intended to provide some of the aspects of the present invention, and is not intended to limit the scope of the invention described and claimed herein.

DESCRIPTION OF EMBODIMENTS

Figure 1:
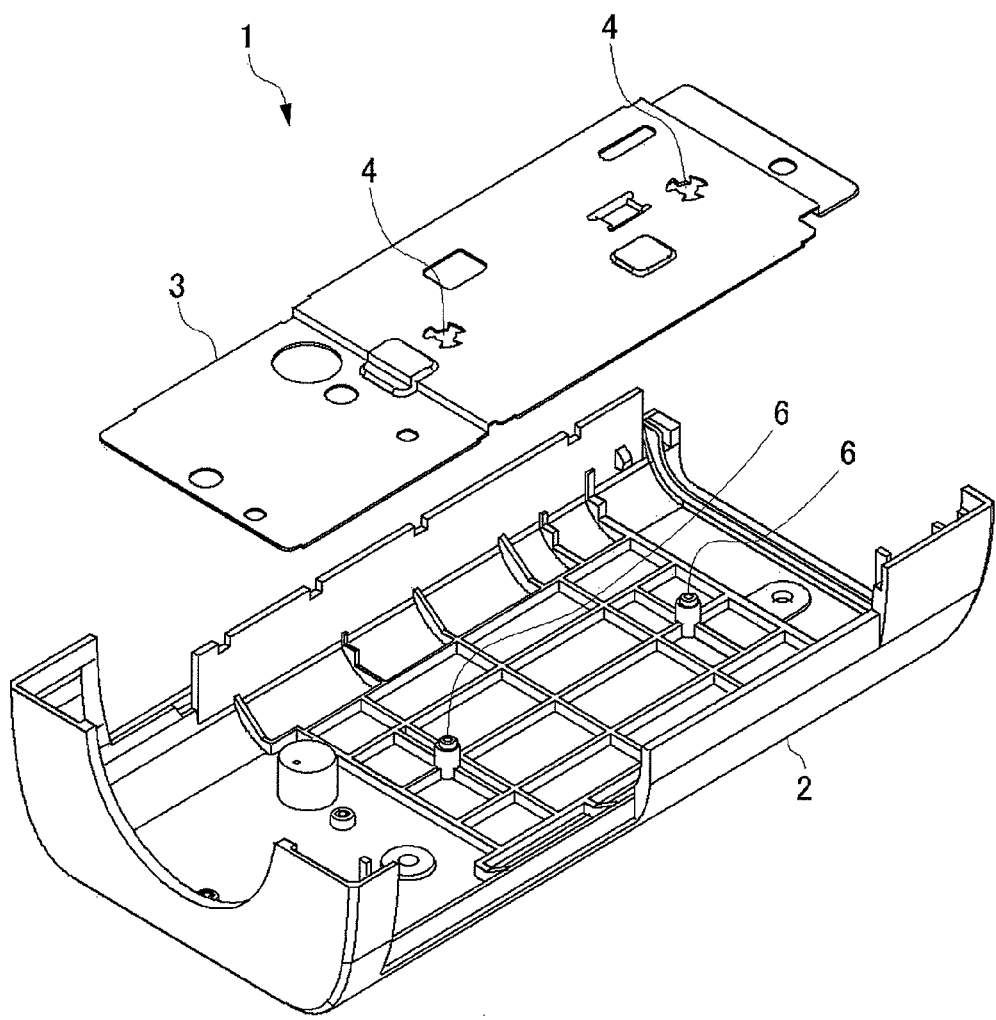
FIG. 1 is an exploded perspective view illustrating an internal structure of an electronic appliance (camera device) according to a first embodiment.

A detailed description of the present invention will be described below. However, the following detailed description and the accompanying drawings are not intended to limit the invention. Instead, the scope of the invention is defined by the appended claims.

An electronic appliance of the present invention has a configuration including a resin case containing electronic components, and a metal shield member to be attached to an inside of the case, wherein the shield member includes at least one staking hole, a plurality of staking tabs which protrude inward are provided around the staking hole, and the case includes a boss in a position corresponding to the staking hole, and wherein in a state where the shield member is attached to the case, the boss is pushed into the staking hole, and the boss is fastened by the plurality of deformed staking tabs so that the shield member is fixed to the case.

In this configuration, when the boss of the case is aligned with the staking hole of the shield member and pushed into the staking hole, the boss is fastened by the deformed staking tabs so that the shield member is fixed to the case. In this way, the shield member can be fixed to the case by the simple process without using an additional part for fixing (a fixation screw, a caulking part, or the like). With this shield member, unwanted radiation from electronic components can be prevented from leaking to the outside of the case. Accordingly, compared to the conventional method of applying a conductive coating material, process steps for application and drying of a conductive coating material and so on are unnecessary, and therefore the number of process steps and the time for fabrication can be reduced, and the manufacturing cost can be kept low.

Further, the electronic appliance of the present invention may have a configuration including a positioning step portion which is caught by the plurality of staking tabs that have not yet been deformed in a state where the shield member is temporarily placed on the case before the shield member is attached to the case.

With this configuration, temporarily placing the shield member on the case, allowing the undeformed staking tabs to catch the positioning step portion of the boss, facilitates alignment of the staking hole of the shield member with the boss of the case.

Further, the electronic appliance of the present invention may have a configuration wherein the shield member includes a plurality of the staking holes, and the case includes a plurality of the bosses in positions corresponding to the staking holes respectively, and wherein the plurality of staking tabs are arranged around each of the plurality of staking holes in a pattern where at most only one of the staking tabs exists on a line segment connecting any two of the plurality of staking holes.

In this configuration, a plurality of staking tabs are each arranged in the pattern where at most only one of the staking tabs exists on a line segment connecting any two of the plurality of staking holes. Therefore, even if the case to which the shield member has been attached is thermally deformed (thermally contracted or thermally expanded), and the relative position of staking holes to bosses is changed, the load due to the thermal deformation of the case can be released.

Further, the electronic appliance of the present invention may have a configuration wherein the shield member includes two staking holes, and the case includes two bosses in positions corresponding to the staking holes respectively, and wherein three staking tabs are arranged around each of the two staking holes in a pattern where only one of the staking tabs exists on a line segment connecting the two staking holes.

In this configuration, three staking tabs are each arranged in the pattern where only one staking tab exists on a line segment connecting two staking holes. Therefore, even if the case to which the shield member has been attached is thermally deformed (thermally contracted or thermally expanded), and the relative position of staking holes to bosses is changed, the load due to the thermal deformation of the case can be released.

Further, the electronic appliance of the present invention may have a configuration wherein the shield member includes two staking holes, and the case includes two bosses in positions corresponding to the staking holes respectively, wherein three staking tabs are arranged around one of the staking holes in a pattern where only one of the staking tabs exists on a straight line connecting the two staking holes, and wherein two staking tabs are arranged around the other of the staking holes in a pattern where none of the staking tabs exists on the straight line connecting the two staking holes.

In this configuration, two staking tabs are arranged around the other of the two staking holes in the pattern where no staking tab exists on a straight line connecting the two staking holes. Therefore, even if the case to which the shield member has been attached is thermally deformed (thermally contracted or thermally expanded), and the relative position of staking holes to bosses is changed, the load due to the thermal deformation of the case can be released.

A camera device of the present invention has a configuration including a resin case containing electronic components for taking a camera image, and a metal shield member to be attached to an inside of the case, wherein the shield member includes at least one staking hole, a plurality of staking tabs which protrude inward are provided around the staking hole, and the case includes a boss in a position corresponding to the staking hole, and wherein in a state where the shield member is attached to the case, the staking hole is fitted around the boss of the case, and the boss is fastened by the plurality of staking tabs so that the shield member is fixed to the case.

Also with this camera device, as described above, when the boss of the case is aligned with the staking hole of the shield member and pushed into the staking hole, the boss is fastened by the deformed staking tabs so that the shield member is fixed to the case. In this way, the shield member can be fixed to the case by the simple process without using an additional part for fixing (a fixation screw, a caulking part, or the like). With this shield member, unwanted radiation from electronic components for taking camera images can be prevented from leaking to the outside of the case. Accordingly, compared to the conventional method including applying a conductive coating material, process steps for application and drying of a conductive coating material and so on are unnecessary, and therefore the number of process steps and the time for fabrication can be reduced, and the manufacturing cost can be kept low.

According to the present invention, a shield member to be attached to the inside of the case is provided with a staking hole. Thereby, unwanted radiation from electronic components can be suppressed, and further, the number of process steps and the time for fabrication can be reduced, and the manufacturing cost can be kept low.

Hereinafter, electronic appliances of embodiments of the present invention will be described with reference to the drawings. While the electronic appliances of the embodiments may be used in, for example, a camera device and the like, the electronic appliances will be illustrated as camera devices in the following embodiments.

(First Embodiment)

Figure 2:
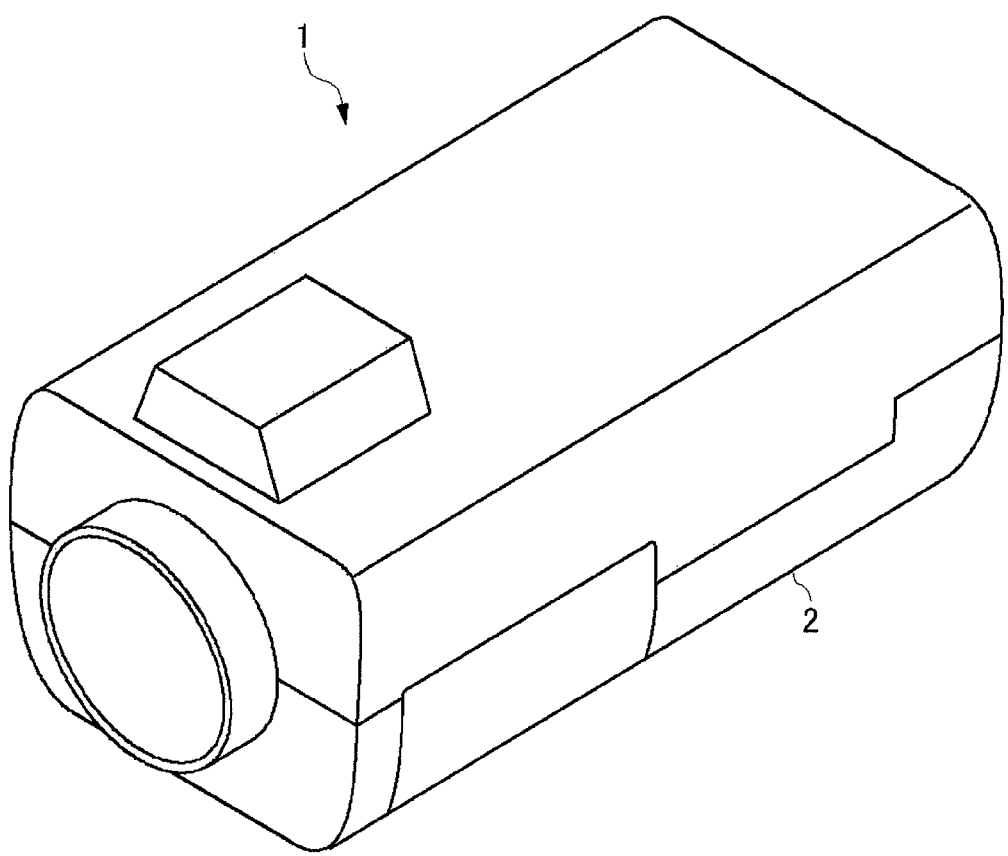
FIG. 2 is a perspective view illustrating an appearance of the electronic appliance (camera device).

First, a configuration of an electronic appliance (camera device) of a first embodiment will be described with reference to the drawings. FIG. 1 is an exploded perspective view illustrating an internal structure of the camera device according to the present embodiment, and FIG. 2 is a perspective view illustrating an appearance of the camera device. As shown in FIGS. 1 and 2, a case 2 of the camera device 1 is made of resin, and configured to be divided into two, upper and lower parts. In the case 2, a board on which electronic components for taking camera images and the like are mounted (not shown) is contained. A metal shield member 3 for blocking unwanted radiation is attached inside the case 2.

Figure 4:
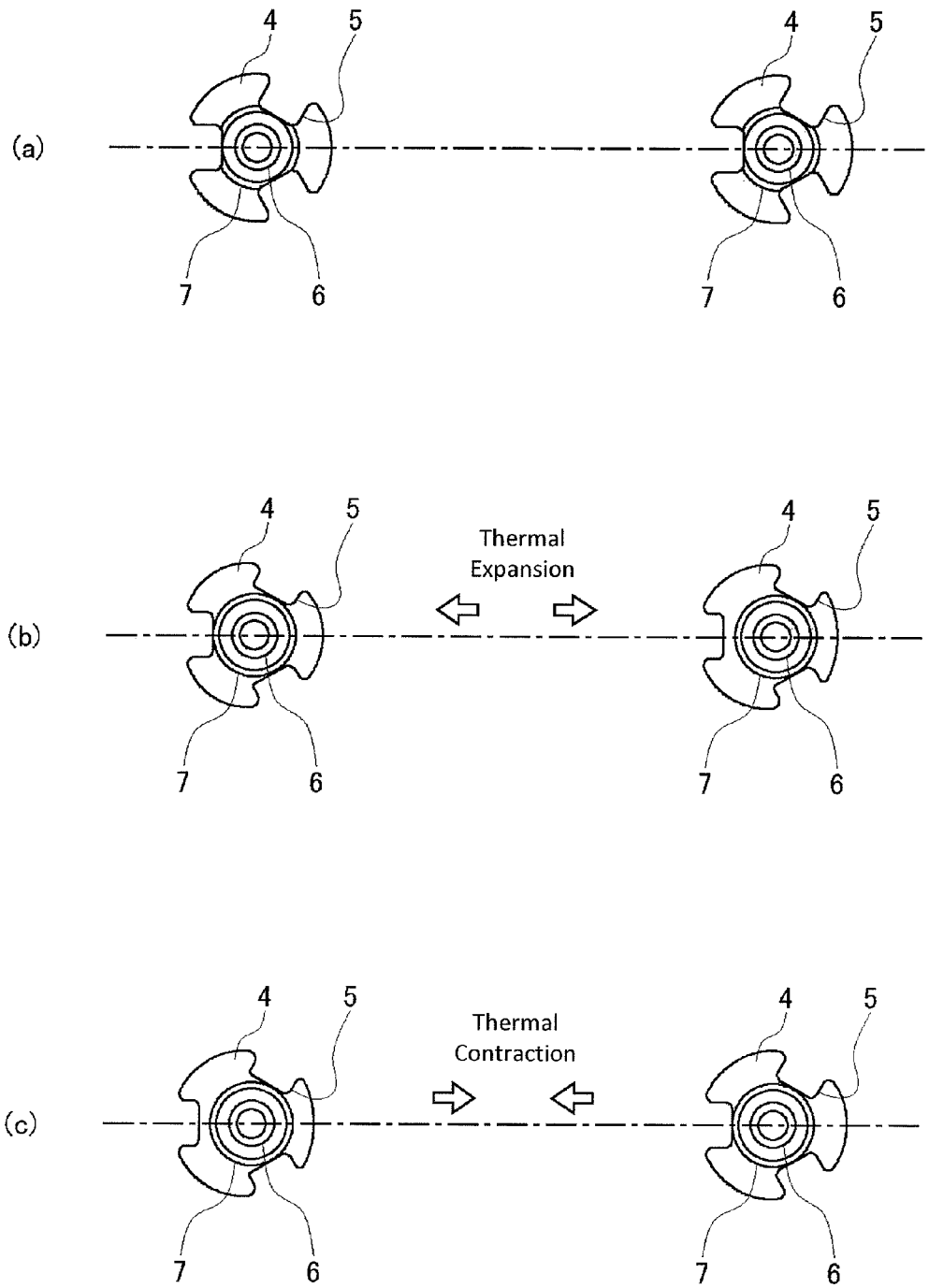
FIG. 4 is a diagram illustrating thermal deformation of the case to which the shield member has been attached.

As shown in FIG. 1, the shield member 3 of the present embodiment is provided with two staking holes 4 having the same shape, and three staking tabs 5 which protrude inward are provided around each staking hole 4 (see FIG. 4). The three staking tabs 5 are arranged around each staking hole 4 in a pattern where only one staking tab 5 exists on a line segment connecting the two staking holes 4. In other words, around one of the two staking holes 4 (the left staking hole 4 in FIG. 4), no staking tab 5 exists on the line segment connecting the two staking holes 4. On the other hand, on the internal face of the case 2, two bosses 6 are provided in a standing manner in positions corresponding to the staking holes 4. In the present embodiment, the distance (pitch) between the two staking holes 4 is set to a relatively short (for example, 50 mm).

Figure 3:
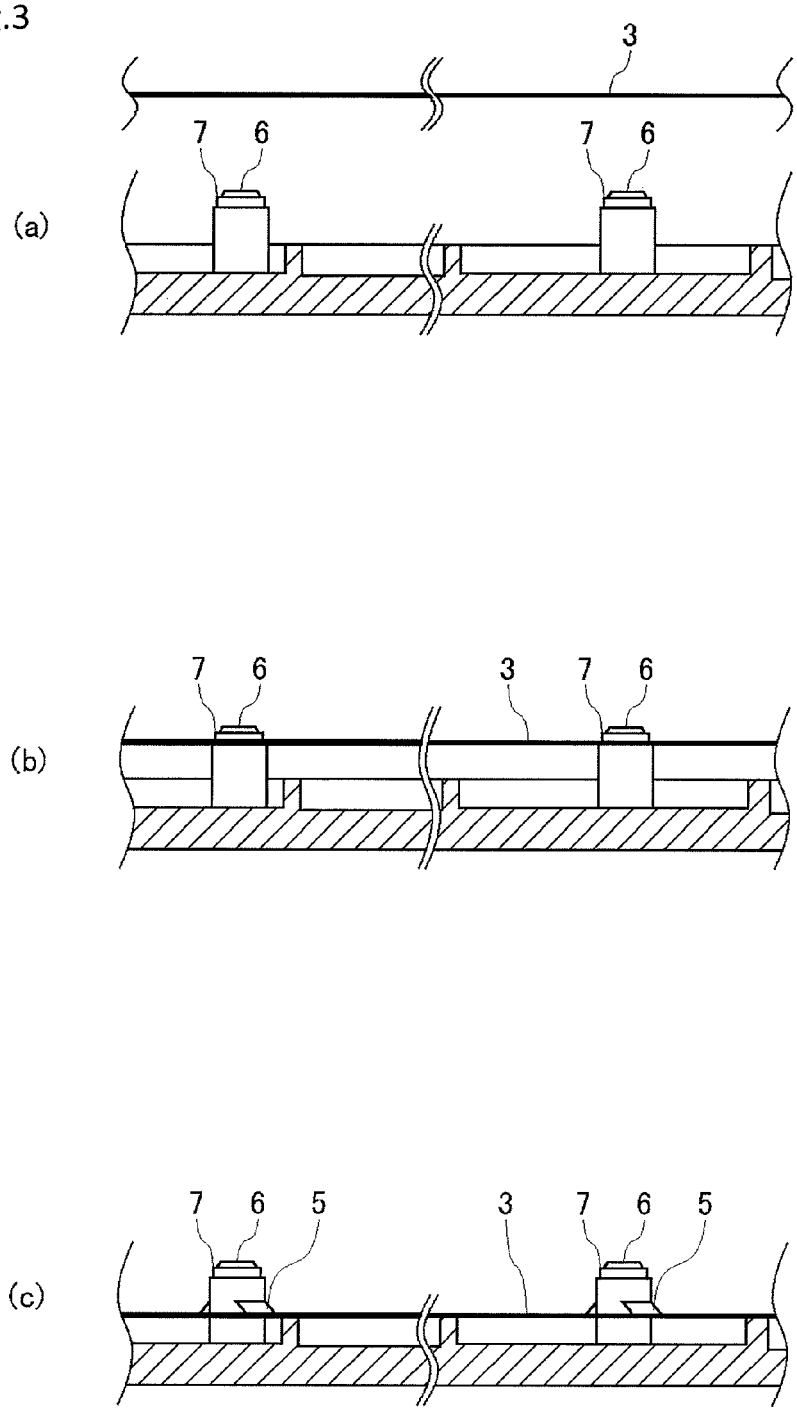
FIG. 3 is a diagram illustrating a shield member being attached to a case of the electronic appliance (camera device).

In addition, a positioning step portion 7 is formed on an upper part of the boss 6 (see FIG. 3), and is configured to be caught by the staking tabs 5 that have not yet been deformed, in a state where the shield member 3 is temporarily placed on the case 2 before the shield member 3 is attached to the case 2. Thus, the outside diameter of the boss 6 has been set to larger than the inside diameter of the undeformed staking tabs 5 (the radius of an inscribed circle of the staking tabs 5), and the outside diameter of the positioning step portion 7 has been set to equal to or smaller than the inside diameter of the undeformed staking tabs 5 (see FIG. 4).

In addition, the staking tabs 5 are configured (their thickness, material, and so on are selected) to be deformed when a certain degree of force is applied thereto. Therefore, starting from a state where the shield member 3 is temporarily placed on the case 2, if the shield member 3 is pushed toward the case 2, then the boss 6 is pushed into the staking hole 4, the staking tabs 5 are deformed, and the boss 6 is fastened by the deformed staking tabs 5 (the shield member 3 is fixed to the case 2), as described later.

A fabrication process of the camera device 1 of the first embodiment configured as described above will be described with reference to the drawings. As a characteristic process of the present invention, a process for attaching the shield member 3 to the case 2 of the camera device 1 will be described here.

First, to attach the shield member 3 to the case 2 of the camera device 1 of the first embodiment, the shield member 3 is arranged above the case 2 to roughly align the staking holes 4 with the bosses 6 as shown in FIG. 3(a). Then, as shown in FIG. 3(b), when the shield member 3 is temporarily placed on the case 2, the undeformed staking tabs 5 catch the positioning step portion 7 of the boss 6 so that the staking hole 4 is aligned with the boss 6 (see FIG. 4(a)). Then, as shown in FIG. 3(c), when the shield member 3 is pushed toward the case 2, the boss 6 is pushed into the staking hole 4, the staking tabs 5 are deformed, and the boss 6 is fastened by the deformed staking tabs 5 so that the shield member 3 is fixed to the case 2. In this way, the shield member 3 can be fixed to the case 2 by the simple process.

There will be described an operation at a time when the case 2 is thermally deformed (thermally contracted or thermally expanded) after the shield member 3 is fixed to the case 2 of the camera device 1 as described above. Because there is a difference in linear expansion coefficient between the resin case 2 and the metal shield member 3, there is a need to release a deformation due to a temperature change (thermal deformation) of the resin case 2 having a large linear expansion coefficient. Incidentally, in the present embodiment, the distance (pitch) between the two staking holes 4 has been set to a relatively short (for example, 50 mm), and accordingly the amount of thermal deformation is relatively small.

For example, the resin case 2 may be thermally deformed (thermally expanded) by heat from a component inside the camera device 1. The distance between the two bosses 6 becomes wider when the case 2 is thermally expanded as shown in FIG. 4(b). Even in this case, in the present embodiment, since no staking tab 5 exists on the line segment connecting the two staking holes 4 (on a line along the direction of deformation of the case 2 by the thermal expansion) around one of the two staking holes 4 (the right staking hole 4 in FIG. 4), the thermal deformation of the case 2 is not much hindered by the staking tabs 5, and the load due to the thermal deformation of the case 2 can be released if the amount of the thermal deformation is relatively small.

On the other hand, the resin case 2 may be thermally deformed (thermally contracted) by cold ambient air, for example, when the camera device 1 is used in a cold district or the like. The distance between the two bosses 6 becomes narrower when the case 2 is thermally contracted as shown in FIG. 4(c). Even in this case, in the present embodiment, since no staking tab 5 exists on the line segment connecting the two staking holes 4 (on a line along the direction of deformation of the case 2 by the thermal contraction) around one of the two staking holes 4 (the left staking hole 4 in FIG. 4), the thermal deformation of the case 2 is not much hindered by the staking tabs 5, and the load due to the thermal deformation of the case 2 can be released if the amount of the thermal deformation is relatively small.

According to the camera device 1 of the first embodiment described above, the shield member 3 to be attached to the inside of the case 2 is provided with the staking holes 4. Thereby, unwanted radiation from electronic components can be suppressed, and further, the number of process steps and the time for fabrication can be reduced, and the manufacturing cost can be kept low.

Specifically, in the present embodiment, when the boss 6 of the case 2 is aligned with the staking hole 4 of the shield member 3 and pushed into the staking hole 4, the boss 6 is fastened by the deformed staking tabs 5 so that the shield member 3 is fixed to the case 2, as shown in FIG. 3(c). In this way, the shield member 3 can be fixed to the case 2 by the simple process without using an additional part for fixing (a fixation screw, a caulking part, or the like). With this shield member 3, unwanted radiation from electronic components can be prevented from leaking to the outside of the case 2. Accordingly, compared to the conventional method including applying a conductive coating material, process steps for application and drying of a conductive coating material and so on are unnecessary, and therefore the number of process steps and the time for fabrication can be reduced, and the manufacturing cost can be kept low.

Further, in the present embodiment, as shown in FIG. 3(b) and FIG. 4(a), temporarily placing the shield member 3 on the case 2, allowing the undeformed staking tabs 5 to catch the positioning step portion 7 of the boss 6, facilitates alignment of the staking hole 4 of the shield member 3 with the boss 6 of the case 2.

Further, in the present embodiment, the plurality of staking tabs 5 are each arranged in the pattern where at most only one of the staking tabs 5 exists on a line segment connecting any two of the plurality of staking holes 4. Therefore, even if the case 2 to which the shield member 3 has been attached is thermally deformed (thermally contracted or thermally expanded), and the relative position of staking holes 4 to bosses 6 is changed, the load due to the thermal deformation of the case 2 can be released. Particularly, as shown in FIGS. 4(b) and (c), the three staking tabs 5 are each arranged in the pattern where only one staking tab 5 exists on the line segment connecting the two staking holes 4, so that the load due to the thermal deformation of the case 2 can be released if the amount of the thermal deformation is relatively small. Thereby, the reliability of the function of suppressing unwanted radiation is improved.

(Second Embodiment)

Next, a configuration of an electronic appliance (camera device) of a second embodiment will be described with reference to the drawings. In the following description, respects different from the first embodiment will be mainly explained. Thus, unless otherwise noted, configurations and operations of the present embodiment are similar to those of the first embodiment.

Figure 5:
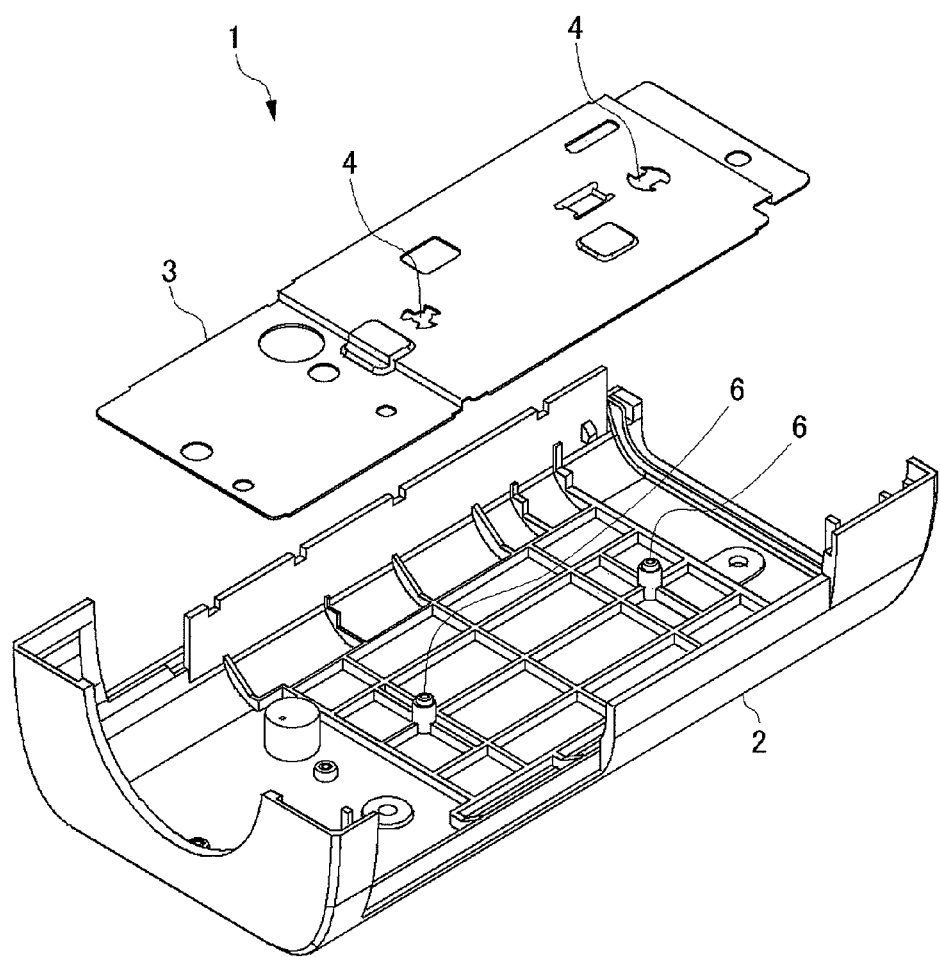
FIG. 5 is an exploded perspective view illustrating an internal structure of an electronic appliance (camera device) according to a second embodiment.

FIG. 5 is an exploded perspective view illustrating an internal structure of the camera device according to the present embodiment. As shown in FIG. 5, a shield member 3 of the present embodiment is provided with two staking holes 4 having different shapes (see FIG. 7). One staking hole 4 (the left staking hole 4 in FIG. 7) has the same shape as in the first embodiment, and three staking tabs 5 which protrude inward are provided around the staking hole 4. Around the other staking hole 4 (the right staking hole 4 in FIG. 7), two staking tabs 5 which protrude inward are provided. These two staking tabs 5 are arranged around the other staking hole 4 in a pattern where no staking tab 5 exists on the straight line connecting the two staking holes 4. In the present embodiment, the distance (pitch) between the two staking holes 4 is set to a relatively long (for example, 100 mm to 150 mm).

A fabrication process of the camera device 1 of the second embodiment configured as described above will be described with reference to the drawings. As with the first embodiment, as a characteristic process of the present invention, a process for attaching the shield member 3 to the case 2 of the camera device 1 will be described here.

Figure 6:
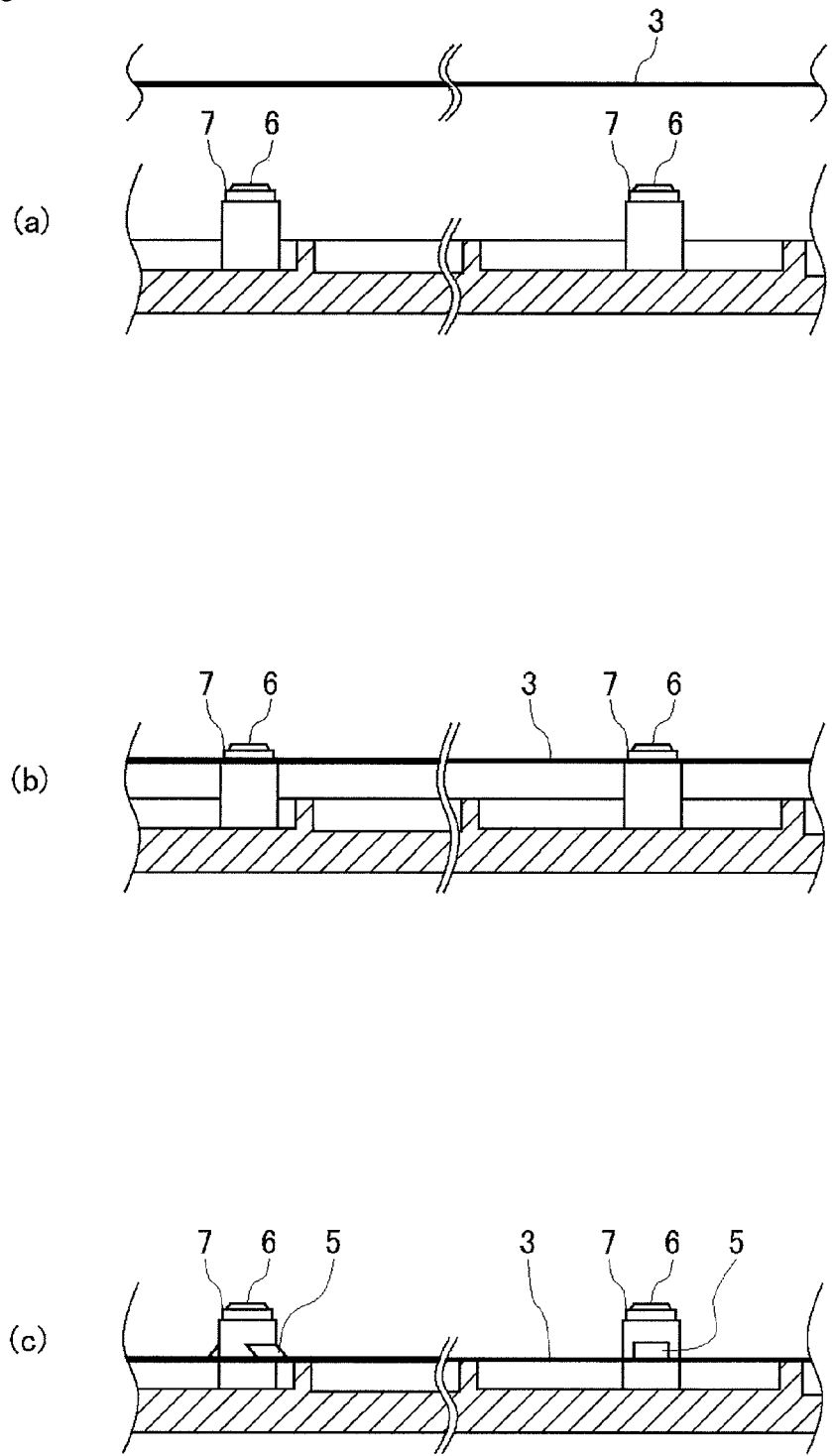
FIG. 6 is a diagram illustrating a shield member being attached to a case of the electronic appliance (camera device).

First, to attach the shield member 3 to the case 2 of the camera device 1 of the second embodiment, the shield member 3 is arranged above the case 2 to roughly align the staking holes 4 with the bosses 6 as shown in FIG. 6(a), in the same manner as in the first embodiment. Then, as shown in FIG. 6(b), when the shield member 3 is temporarily placed on the case 2, the undeformed staking tabs 5 catch the positioning step portion 7 of the boss 6 so that the staking hole 4 is aligned with the boss 6 (see FIG. 7(a)). Then, as shown in FIG. 6(c), when the shield member 3 is pushed toward the case 2, the boss 6 is pushed into the staking hole 4, the staking tabs 5 are deformed, and the boss 6 is fastened by the deformed staking tabs 5 so that the shield member 3 is fixed to the case 2. In this way, the shield member 3 can be fixed to the case 2 by the simple process.

There will be described an operation at a time when the case 2 is thermally deformed (thermally contracted or thermally expanded) after the shield member 3 is fixed to the case 2 of the camera device 1 as described above. Incidentally, in the present embodiment, the distance (pitch) between the two staking holes 4 has been set to a relatively long (for example, 100 mm to 150 mm), and accordingly the amount of thermal deformation is relatively large.

Figure 7:
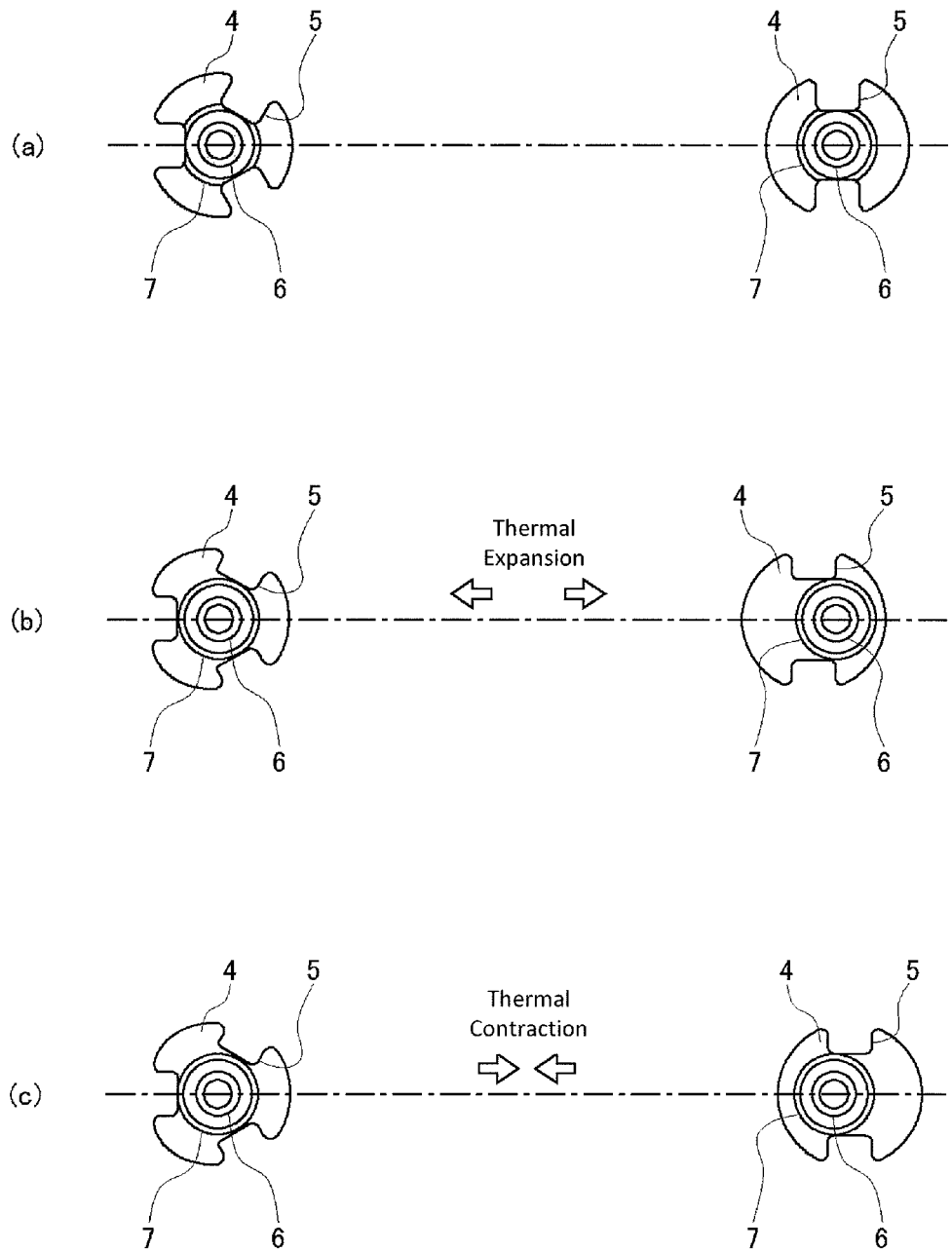
FIG. 7 is a diagram illustrating thermal deformation of the case to which the shield member has been attached.

For example, the resin case 2 may be thermally deformed (thermally expanded) by heat from a component inside the camera device 1 or the like. The distance between the two bosses 6 becomes wider when the case 2 is thermally expanded as shown in FIG. 7(b). Even in this case, in the present embodiment, since no staking tab 5 exists on the straight line connecting the two staking holes 4 (on a line along the direction of deformation of the case 2 by the thermal expansion) around one of the two staking holes 4 (the right staking hole 4 in FIG. 7), the thermal deformation of the case 2 is little hindered by the staking tabs 5, and the load due to the thermal deformation of the case 2 can be released even if the amount of the thermal deformation is relatively large.

On the other hand, the resin case 2 may be thermally deformed (thermally contracted) by cold ambient air, for example, when the camera device 1 is used in a cold district or the like. The distance between the two bosses 6 becomes narrower when the case 2 is thermally contracted as shown in FIG. 7(c). Even in this case, in the present embodiment, since no staking tab 5 exists on the straight line connecting the two staking holes 4 (on a line along the direction of deformation of the case 2 by the thermal contraction) around one of the two staking holes 4 (the right staking hole 4 in FIG. 7), the thermal deformation of the case 2 is little hindered by the staking tabs 5, and the load due to the thermal deformation of the case 2 can be released even if the amount of the thermal deformation is relatively large.

In this way, operational advantages similar to those of the first embodiment can also be obtained by the camera device 1 of the second embodiment.

In this case, since the two staking tabs 5 are arranged in a pattern where no staking tabs 5 exists on the straight line connecting the two staking holes 4 around the other of the two staking holes 4 as shown in FIGS. 7(b) and (c), even if the case 2 to which the shield member 3 has been attached is thermally deformed (thermally contracted or thermally expanded), and the relative position of staking holes 4 to bosses 6 is changed, the load due to the thermal deformation of the case 2 can be released. Thereby, the reliability of the function of suppressing unwanted radiation is improved.

Although the embodiments of the present invention have been described by way of example, the scope of the present invention is not limited to them, and changes and modifications can be made for any purpose within the scope of the claims.

Although the presently conceivable preferred embodiments of the present invention have been described above, it is understood that various modifications can be made to the embodiments, and it is intended that the appended claims cover all such modifications that fall within the true sprit and scope of the present invention.

Industrial Applicability

As described above, an electronic appliance according to the present invention has advantages that unwanted radiation from electronic components can be suppressed, and further the number of process steps and the time for fabrication can be reduced, and the manufacturing cost can be kept low, and it is useful as a camera device or the like.

Reference Signs List
1 Camera device (electronic appliance)
2 Case
3 Shield member
4 Staking hole
5 Staking tab
6 Boss
7 Positioning step portion

The invention claimed is:

1. An electronic appliance comprising:
a resin case containing electronic components, and a metal shield member to be attached to an inside of the case,
wherein the shield member comprises at least one staking hole, a plurality of staking tabs which protrude inwardly are provided around the staking hole, and the case comprises a boss in a position corresponding to the staking hole,
the boss including positioning step configured to be engaged by the plurality of undeformed staking tabs when the shield member is placed on the case, and before the shield member is attached to the case; and
wherein, when the shield member is attached to the case, the boss is pushed into the staking hole, deforms the plurality of staking tabs and the boss is fastened by the plurality of deformed staking tabs so that the shield member is fixed to the case.

2. The electronic appliance according to claim 1,
wherein the shield member comprises a plurality of the staking holes, and the case comprises a plurality of the bosses in positions corresponding to the staking holes respectively, and
wherein the plurality of staking tabs are arranged around each of the plurality of staking holes in a pattern where at most only one of the staking tabs is present along a line segment connecting centers of any two of the plurality of staking holes.

3. The electronic appliance according to claim 2,
wherein the shield member comprises two said staking holes, and the case comprises two said bosses in positions corresponding to the staking holes respectively, and
wherein three said staking tabs are arranged around each of the two staking holes in a pattern where only one of the staking tabs is present along a line segment connecting centers of the two staking holes.

4. The electronic appliance according to claim 2,
wherein the shield member comprises two said staking holes, and the case comprises two said bosses in positions corresponding to the staking holes respectively,
wherein three said staking tabs are arranged around one of the staking holes in a pattern where only one of the staking tabs is present along a straight line connecting centers of the two staking holes, and
wherein two said staking tabs are arranged around the other of the staking holes in a pattern where none of the staking tabs is present along the straight line connecting centers of the two staking holes.

5. The electronic appliance according to claim 1, wherein the outer diameter of the boss is larger than the inner diameter of the staking tabs and the outer diameter of the positioning step is equal to or smaller than the inner diameter of the staking tabs.

6. A camera device comprising:
a resin case containing electronic components for taking a camera image, and a metal shield member to be attached to an inside of the case,
wherein the shield member comprises at least one staking hole, a plurality of staking tabs protrude inwardly around the staking hole, and the case comprises a boss in a position corresponding to the staking hole,
the boss including positioning step configured to be engaged by the plurality of undeformed staking tabs when the shield member is placed on the case, and before the shield member is attached to the case; and
wherein when the shield member is attached to the case, the staking hole is fitted around the boss of the case, and the boss is fastened by the plurality of staking tabs so that the shield member is fixed to the case.

7. The camera device according to claim 6, wherein the shield member comprises a plurality of the staking holes, and the case comprises a plurality of the bosses in positions corresponding to the staking holes respectively, and
wherein the plurality of staking tabs are arranged around each of the plurality of staking holes in a pattern such that at most only one of the staking tabs is present along a line segment connecting centers of any two of the plurality of staking holes.

8. The camera device according to claim 7, wherein the shield member comprises two said staking holes, and the case comprises two said bosses in positions corresponding to the staking holes respectively, and
wherein three said staking tabs are arranged around each of the two staking holes in a pattern such that only one of the staking tabs is present along a line segment connecting centers of the two staking holes.

9. The camera device according to claim 7, wherein the shield member comprises two said staking holes, and the case comprises two said bosses in positions corresponding to the staking holes respectively,
wherein three said staking tabs are arranged around one of the staking holes in a pattern such that only one of the staking tabs is present along a straight line connecting centers of the two staking holes, and
wherein two said staking tabs are arranged around the other of the staking holes in a pattern such that none of the staking tabs is present along the straight line connecting centers of the two staking holes.

10. The camera device according to claim 6, wherein the outer diameter of the boss is larger than the inner diameter of the staking tabs and the outer diameter of the positioning step is equal to or smaller than the inner diameter of the staking tabs.

11. An electronic appliance comprising:
a resin case containing electronic components, and a metal shield member attachable to an inside of the case,
wherein the shield member comprises a plurality of staking holes, a plurality of staking tabs protrude inwardly around the staking hole, and the case comprises a plurality of bosses in positions corresponding to the plurality of staking holes respectively,
wherein the plurality of staking tabs are arranged around each of the plurality of staking holes in a pattern such that at most only one of the staking tabs is present along a line segment connecting centers of any two of the plurality of staking holes,
wherein, when the shield member is attached with the case, the boss is pushed into the staking hole, deforms the plurality of staking tabs, and the boss is fastened by the plurality of deformed staking tabs so that the shield member is fixed to the case.

12. The electronic appliance according to claim 11, further comprising a positioning step provided on an upper part of each boss, the outer diameter of the boss is larger than the inner diameter of the staking tabs and the outer diameter of the positioning step is equal to or smaller than the inner diameter of the staking tabs.

* * * * *